(12) United States Patent
Yates

(10) Patent No.: US 7,018,937 B2
(45) Date of Patent: Mar. 28, 2006

(54) COMPOSITIONS FOR REMOVAL OF PROCESSING BYPRODUCTS AND METHOD FOR USING SAME

(75) Inventor: Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 10/231,416

(22) Filed: Aug. 29, 2002

(65) Prior Publication Data

US 2004/0043610 A1 Mar. 4, 2004

(51) Int. Cl.
*H01L 21/302* (2006.01)

(52) U.S. Cl. .................. 438/745; 438/753; 438/755; 134/2; 510/175

(58) Field of Classification Search ........ 510/175–178; 438/745, 753–757; 134/1.2–1.3, 2–3
See application file for complete search history.

(56) References Cited

U.S. PATENT DOCUMENTS

| | | | |
|---|---|---|---|
| 4,215,005 A * | 7/1980 | Vander Mey | 510/176 |
| 6,012,469 A | 1/2000 | Li et al. | |
| 6,090,721 A | 7/2000 | Yates | |
| 6,117,351 A | 9/2000 | Li et al. | |
| 6,165,803 A | 12/2000 | Chen et al. | |
| 6,192,899 B1 | 2/2001 | Li et al. | |
| 6,310,018 B1 * | 10/2001 | Behr et al. | 517/175 |
| 6,316,370 B1 | 11/2001 | Mercaldi et al. | |
| 6,417,561 B1 | 7/2002 | Tuttle | |
| 6,453,914 B1 | 9/2002 | Torek et al. | |
| 6,473,328 B1 | 10/2002 | Mercaldi | |
| 6,485,989 B1 | 11/2002 | Signorini | |
| 6,486,108 B1 | 11/2002 | Yates et al. | |
| 6,492,309 B1 * | 12/2002 | Behr et al. | 510/175 |
| 6,517,738 B1 | 2/2003 | Torek et al. | |
| 6,521,931 B1 | 2/2003 | Sandhu et al. | |
| 6,562,726 B1 | 5/2003 | Torek et al. | |
| 2002/0139387 A1 * | 10/2002 | Yates | 134/1 |
| 2002/0173156 A1 | 11/2002 | Yates et al. | |
| 2003/0003762 A1 * | 1/2003 | Cotte et al. | 438/745 |
| 2003/0125225 A1 * | 7/2003 | Xu et al. | 510/175 |
| 2003/0216269 A1 * | 11/2003 | DeYoung et al. | 510/175 |

OTHER PUBLICATIONS

Morrison and Boyd, Organic Chemistry 4th ed, Allyn and Bacon: Boston, 1983, p. 735.*
CRC Handbook of Chemistry and Physics, 63rd ed, CRC Press: Boca Raton, Florida, 1982, p. F-74, Table II.*
http://safety.dri.edu/Hazards/HydrofluoricAcidGuidelines.pdf.*

(Continued)

*Primary Examiner*—Laura M. Schillinger
*Assistant Examiner*—Thanhha Pham
(74) *Attorney, Agent, or Firm*—Mueting, Raasch & Gebhardt, P.A.

(57) ABSTRACT

A composition and methods for using the composition in removing processing byproducts is provided. The composition can be non-aqueous or semi-aqueous. The non-aqueous composition includes a non-aqueous solvent and one or more components including a fluoride compound and a pyridine compound. The semi-aqueous composition includes glacial acetic acid and one or more components including a fluoride compound and a pyridine compound. The composition can be used in removing processing byproducts from substrate assembly, including MRAM devices, that include at least a metal containing region and processing byproducts, where removing the processing byproducts includes exposing the substrate assembly to the composition for a time effective to remove at least a portion of the processing byproducts.

7 Claims, 2 Drawing Sheets

OTHER PUBLICATIONS

Butner, "Computing Unplugged," IBM Think Research, [online]. [Retrieved on Jun. 19, 2002]. Retrieved from the Internet:<http://www.research.ibm.com./thinkresearch/pages.2001/20010202_mram.shtml.

Daughton, "Advanced MRAM Concepts," Feb. 7, 2001: 1-6.

Daughton, "Magnetoresistive Random Access Memory (MRAM)," Feb. 4, 2000: 1-13.

Wolfe et al., "Wet Processing: Cleaning, Etching and Liftoff," *Silicon Processing for the VLSI Era vol. 1-Process Technology*; Sunset Beach, CA 1986; 514-537.

Wolfe et al., "Dry Etching for VLSI Fabrication," *Silicon Processing for the VLSI Era vol. 1-Process Technology*; Sunset Beach, CA 1986; 539-581.

\* cited by examiner

COMPOSITIONS FOR REMOVAL OF PROCESSING BYPRODUCTS AND METHOD FOR USING SAME

FIELD OF THE INVENTION

The present invention relates to the fabrication of integrated circuits, and in particular, to compositions used in and methods for removal of processing byproducts created during the fabrication of integrated circuits.

BACKGROUND OF THE INVENTION

Patterning materials is an integral part of integrated-circuit (IC) processing. The patterning process may include a variety of processing techniques, including, for example, photo-lithographic processing, etching of metal stacks, resist stripping, etc. Such patterning processes are used in the production of various devices, such as, for example, memory devices. Examples of memory devices include dynamic random access memory (DRAM) devices and magnetoresistive random access memory (MRAM) devices.

Many patterning steps result in the generation of processing byproducts that must be removed to maintain device integrity. For example, reactive ion etching (RIE) can cause residue contamination where byproducts remain on the surfaces of the structure being processed. For example, byproducts or residue may include halogen-based residues (e.g., fluorocarbon byproducts when a $CHF_3$ etchant is used), metal halides (e.g., when a chlorine containing etchant is used to pattern metal stacks), organosilicates (e.g., when silicon is present during an etching process), etc. Contamination during production can lead to, besides other things, bond disruption of subsequently applied layers, and increased resistance, both of which can affect reliability of the device being processed. As such, byproducts of patterning process steps need to be removed.

Structures resulting from patterning processes can include a variety of patterned metal containing surfaces. These metal-containing surfaces can include, for example, in the case of forming MRAM devices, metals such as nickel, cobalt, iron and alloys thereof. During processing, these metal-containing surfaces can be exposed to etch byproducts. Various aqueous compositions are capable of removing the byproducts, such as, organosilicates, metal halides, and other compounds formed after patterning of such structures. For example, such aqueous compositions may include HF, HCl, HNO3, among other components. However, using aqueous based compositions in removing these etch byproducts can lead to oxidation/corrosion of the metal-containing surfaces (e.g., nickel, iron, etc.). In other words, the water present in these compositions can lead to undesirable oxidation of the metal surfaces. In addition, the presence of water can allow for the formation of reactive chemical species that can have corrosive effects on the structure. Thus, cleaning etch byproducts with aqueous based compositions is typically undesirable.

SUMMARY OF THE INVENTION

In view of the foregoing, there is a need in the semiconductor art for compositions that can effectively remove etch byproducts without having detrimental or corrosive effects on the structures that are being cleaned. Accordingly, the present invention is directed to a composition for use in removing processing byproducts. The composition can include a non-aqueous composition or a semi-aqueous composition, both of which are for use in removing processing byproducts, a method for use in removing processing byproducts, and a method for use in removing processing byproducts in fabrication of a magnetoresistive random access memory (MRAM) device.

One aspect of the present invention includes a non-aqueous composition for use in removing processing byproducts. The non-aqueous composition includes a non-aqueous solvent and one or more components including a fluoride compound and a pyridine compound. In one example, the non-aqueous solvent preferably includes at least one solvent selected from the group consisting of ketones, alcohols, and aldehydes. More preferably, the non-aqueous solvent includes acetone.

In addition, the one or more components preferably include hydrogen fluoride and pyridine. In one example, the fluoride compound includes at least one fluoride compound selected from the group consisting of hydrogen fluoride, triethylaminetrihydrofluoride, tetra-methyl ammonium fluoride, and tetra-ethyl ammonium fluoride. Preferably, the one or more components include hydrogen fluoride-pyridine. In one preferred example, the composition includes a ratio of the acetone to the one or more components including pyridine and hydrogen fluoride in a range of about 200:1 to about 50:1 by volume. Preferably, the composition is used at a temperature of no greater than about 50 degrees Celsius. More preferably, the composition is used at a temperature of about 25 degrees Celsius to about 50 degrees Celsius.

An additional aspect of the present invention includes a semi-aqueous composition for use in removing processing byproducts. The semi-aqueous composition includes glacial acetic acid, and one or more components including a fluoride compound and a pyridine compound. In one example, the semi-aqueous solvent preferably includes one or more components that preferably include hydrogen fluoride and pyridine. In one example, the fluoride compound includes at least one fluoride compound selected from the group consisting of hydrogen fluoride, triethylaminetrihydrofluoride, tetra-methyl ammonium fluoride, and tetra-ethyl ammonium fluoride. Preferably, the one or more components include hydrogen fluoride-pyridine. In one preferred example, the composition includes a ratio of the glacial acetic acid to the one or more components including pyridine and hydrogen fluoride is in a range of about 400:1 to about 160:1 by volume. Preferably, the composition is used at a temperature of no greater than about 50 degrees Celsius. More preferably, the composition is used at a temperature of about 25 degrees Celsius to about 50 degrees Celsius.

The present invention also includes a method for use in removing processing byproducts. In one example, processing byproducts are formed during the patterning the at least one metal containing material to form a patterned metal containing structure. A variety of etchants can be used in removing at least a portion of a metal containing material during the patterning of the at least one metal containing material. For example, the etchant can include chlorine. The resulting processing byproducts can include at least one of silicon and metal halides.

Preferably, the method includes providing the substrate assembly that includes at least a metal containing region and processing byproducts, and exposing the substrate assembly to the non-aqueous composition, as discussed, for a time effective to remove at least a portion of the processing byproducts. In an alternative embodiment, the method includes providing a substrate assembly including at least a metal containing region and processing byproducts, and exposing the substrate assembly to the semi-aqueous composition, as discussed, for a time effective to remove at least a portion of the processing byproducts.

The processing byproducts may include at least one of silicon and metal halides. In addition, the time effective to remove at least a portion of the processing byproducts from the metal containing region with the non-aqueous composition is in a range of about 5 minutes to about 20 minutes. Alternatively, for the semi-aqueous composition, the time effective to remove at least a portion of the processing byproducts from the metal containing region is in a range of about 30 seconds to about 4 minutes.

Preferably, the non-aqueous or semi-aqueous compositions of the present invention are used in methods for removing processing byproducts during the fabrication of magnetoresistive random access memory (MRAM) devices. For example, a substrate assembly including at least a patterned MRAM metal stack is provided, where the metal stack includes at least one or more magnetic layers. The MRAM metal stack can be patterned using any number of techniques that result in processing byproducts. For example, the MRAM metal stack can be patterned using a hard mask, where the patterning of the MRAM metal stack results in processing byproducts. The processing byproducts of the substrate assembly are then exposed to either the non-aqueous composition or the semi-aqueous composition for a time effective to remove at least a portion of the processing byproducts from the patterned MRAM metal stack of the substrate assembly.

These and other features and advantages of the present invention will be apparent from the following description of various embodiments and as illustrated in the accompanying figures.

DESCRIPTION OF THE EMBODIMENTS

Figure 1A:
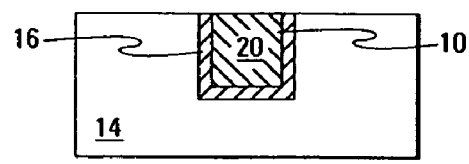
FIGS. 1A to 1E are cross-sectional representations of an MRAM structure, and intervening structure thereof, having etch residue cleaned by the compositions of the present invention.

In the following detailed description, reference is made to the accompanying Figures that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention as defined in the accompanying claims.

Generally, the present invention provides compositions for use in removing processing byproducts that are formed during fabrication of IC devices, such as memory devices (e.g., MRAM devices). In particular, the compositions of the present invention can include non-aqueous compositions having a non-aqueous solvent and semi-aqueous compositions having a semi-aqueous solvent. The non-aqueous and semi-aqueous compositions also include one or more components including at least a fluoride compound and a pyridine compound. These compositions can be used, for example, in removing processing byproducts, such as those created during patterning of metal materials, without significantly contributing to either oxidation and/or corrosion of the structures resulting therefrom.

As indicated above, the present invention includes non-aqueous and semi-aqueous compositions for use in removing processing byproducts that are present on substrate assemblies. As used in this application, "substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

As used herein, non-aqueous compositions can be defined as having essentially no water. Preferably, non-aqueous compositions have less than 10 percent water by volume of the composition. More preferably, non-aqueous compositions have less than 5 percent water by volume of the composition. Most preferably, non-aqueous compositions have no water by volume of the composition.

In contrast, semi-aqueous compositions of the present invention include those compositions that have at least a certain percentage of water by volume, but no greater than 10 percent water by volume of the composition. Preferably, semi-aqueous compositions include those compositions that have no greater than 5 percent water by volume of the composition.

Preferably, the non-aqueous or semi-aqueous compositions of the present invention include a solvent, and one or more components that include a fluoride compound and a pyridine compound. The fluoride compound and the pyridine compound may be either separate compounds or a single compound. The compositions of the present invention can be used in removing a variety of processing byproducts from a substrate assembly.

The byproducts may result from processing steps, such as, for example, RIE, photoresist removal, chlorinated etches, patterning using photoresists, patterning using a hard mask, and/or over etch of layers (e.g., dielectric layers, silicate layers, etc.). These byproducts include, but are not limited to, silicates, including organosilicates, metal halides, transition metals, organic residue of etch-related polymers, chlorine based etchant, bromine based etchant, fluorine based etchant, and other undesirable compounds resulting during formation of the IC structures. Preferably, the compositions of the present invention are used in removing byproducts from the surface of IC structures resulting from patterning processes, e.g., reactive ion etching, such as metal etching using a chlorine based etchant. The compositions of the present invention can be used to remove the byproducts without promoting the corrosion of the exposed metal surfaces.

The compositions of the present invention can also be effective when any number of metal surfaces are present as byproducts are removed. In other words, metal surfaces, or regions, of a substrate assembly being cleaned with the compositions of the present invention may include, but are not limited to, iron, cobalt, nickel, iridium, manganese, tantalum, tantalum composites (TaN), aluminum, copper, and alloys thereof. Preferably, the application of the compositions of the present invention follows the patterning of a metal layer in the fabrication process (e.g., in an MRAM device fabrication process). The present invention has the ability to attack process byproducts, such as reactive ion etch silicates and metal halide residues, with a non-aqueous or semi-aqueous, non-corrosive composition.

As discussed above, the non-aqueous and semi-aqueous compositions of the present invention include a solvent. Preferably, the solvent for the semi-aqueous composition is a semi-aqueous solvent, preferably glacial acetic acid.

The non-aqueous compositions of the present invention include non-aqueous solvents. Preferably, the non-aqueous solvents include one or more ketones, alcohols, or aldehydes. For example, the non-aqueous solvents may include acetone, isopropyl or ethyl alcohol. Suitable solvents can also include one or blends of the following: saturated or unsaturated linear, branched, or cyclic aliphatic (alicyclic) hydrocarbons (preferably $C_2$ to $C_{20}$, more preferably $C_3$ to $C_{10}$), aromatic hydrocarbons (preferably $C_5$ to $C_{20}$, more preferably $C_5$ to $C_{10}$), halogenated hydrocarbons, silylated hydrocarbons such as alkylsilanes, ethers, polyethers, thioethers, esters, lactones, amides, amines, (aliphatic or aromatic, primary, secondary, tertiary), polyamines, nitriles, cyanates, isocyanates, thiocyanates, aldehydes, ketones, diketones, carboxylic acids, carbonates, alcohols (mono and polyols), thiols, sulfones and sulfoxides. Preferably, the non-aqueous solvent is acetone.

As discussed above, the one or more components including the fluoride compound and the pyridine compound can be provided as multiple components or as a single component. In other words, the fluoride compound and the pyridine compound can be the same or different compounds. When multiple components are used, the one or more components including fluoride compounds may, for example, include an anhydrous fluoride, hydrogen fluoride, triethylaminetrihydrofluoride, tetramethylammonium fluoride, and tetraethylammonium fluoride.

Fluorine sources can also consist particularly of an organic cation, and fluoride ions. Suitable sources can be associated with a variety of organic compounds, typically cations, such as organic quaternary compounds containing group 15 elements. Varying examples include, but are not limited to, organoammonium cations, as present in tetraethylammonium fluoride and benzyltrimethylammonium hydrogen difluoride; pyridinium as present in pyridinium poly(hydrogen fluoride); quaternary organophosphonium cations, as present in tetraphenylphosphonium fluoride; quaternary organoarsonium cations, as present in tetraphenylarsonium fluoride; quaternary organostibonium cations, as present in tetraphenylstibonium fluoride; and triorganocarbonium cations, as present in triphenylcarbonium fluoride.

Further, when multiple components are used, the components including pyridine according to the present invention may, for example, include any pyridine containing compound, including pyridine.

Preferably, the one or more components that include the fluoride compound and the pyridine compound according to the present invention are a single component, hydrogen fluoride-pyridine (HF-pyridine). Preferably, the hydrogen fluoride-pyridine as the single component has a concentration of hydrogen fluoride that is at least 70 percent by weight. In other words, the hydrogen fluoride-pyridine as the single component has no less than about 70 percent hydrogen fluoride by weight. One preferred example of HF-pyridine as a single component has Chemical Abstracts Service Registry Number 32001-55-1. In addition, it is possible that the hydrogen fluoride-pyridine as the single component can also have a concentration of hydrogen fluoride of less than 70 percent by weight.

Preferably, the non-aqueous compositions of the present invention include a ratio of ketone to hydrogen fluoride-pyridine that is less than about 200:1 by volume. Further, preferably, the ratio of ketone to hydrogen fluoride-pyridine is greater than about 50:1 by volume. More preferably, for the non-aqueous compositions of the present invention the ketone to hydrogen fluoride-pyridine has a ratio that is less than about 200:1 and greater than about 50:1 by volume. Preferably, the ketone for the foregoing ratios is acetone.

Preferably, the semi-aqueous compositions of the present invention include a ratio of glacial acetic acid to hydrogen fluoride-pyridine that is less than about 400:1 by volume. Further, preferably, the ratio of glacial acetic acid to hydrogen fluoride-pyridine is greater than about 160:1 by volume. More preferably, for the semi-aqueous compositions of the present invention the glacial acetic acid to hydrogen fluoride-pyridine has a ratio that is less than about 400:1 and greater than about 160:1 by volume.

The compositions of the present invention can be useful in removing processing byproducts (e.g., cleaning structures) during the fabricating of various devices. The present invention is particularly beneficial in removing byproducts after patterning metal containing structures, such as in the patterning of metal containing stacks of a MRAM device. FIGS. 1A to 1E illustrate an exemplary MRAM structure fabrication process and intermediate structures thereof. Dimensions and scaling in the Figures are not exact, but represent the nature of fabricating an MRAM structure in general and the necessity for utilizing a composition of the present invention for cleaning intermediate structures thereof. In addition, while an MRAM structure is illustrated herein, it is understood that many other types of corrosion sensitive structures may be cleaned of processing byproducts using a composition of the present invention, as well as other types of structures.

The MRAM structure can include an interconnect 10, as shown in FIG. 1A. Preferably, the process for forming the interconnect is by a copper damascene process. Such interconnect structures are generally formed in a dielectric layer 14, and include barrier and seed layers (shown collectively at 16), and a plated conductive layer 20 (e.g., a copper conductive layer). The interconnect 10 can act as either a word line or a bit line in the MRAM architecture, and can be used in a cross point matrix to provide magnetic fields for bit programming.

Figure 1B:
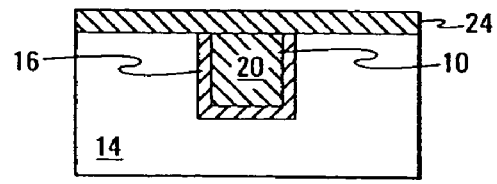

An interlayer 24 of a dielectric material is then provided on the interconnect 10 (shown in FIG. 1B). The interlayer 24 is typically formed of an insulative material, such as a silicon nitride, aluminum oxide, aluminum nitride, or silicon oxy-nitride material. An MRAM metal stack 30 (shown in FIG. 1C) can be provided over the interlayer 24 as shown in FIG. 1D. The MRAM metal stack 30 can have a sandwich-type structure that includes one or more magnetic element layers for forming magnetic memory elements. The MRAM metal stack 30 can be formed by any known process, e.g., physical vapor deposition (PVD) or ion beam deposition techniques. The present invention is not limited to any particular layer formation techniques.

Figure 1C:
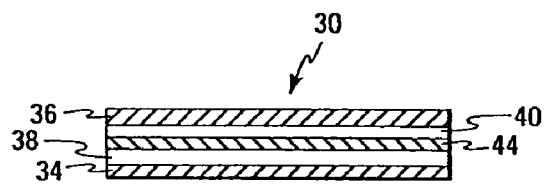
Figure 1D:
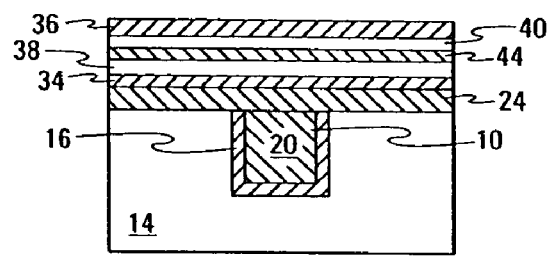
Figure 1E:
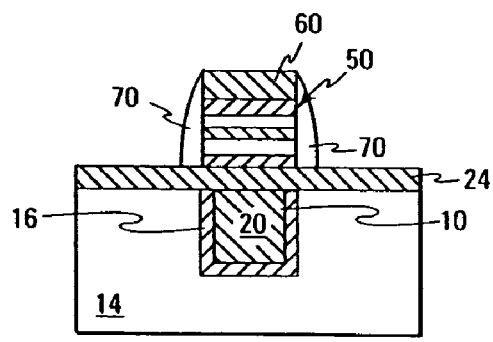

The illustrative MRAM metal stack 30 includes non-magnetic resistive layers 34 and 36, a bottom and a top magnetic layer 38 and 40, and a dielectric layer 44, as shown in FIGS. 1C–1E. For example, the non-magnetic resistive layers 34 and 36 may be of a tantalum-containing compound. For example, the tantalum-containing compound can include, but is not limited to tantalum (Ta) or tantalum nitride (TaN). The bottom and the top magnetic layers 38 and 40 may include magnetic material such as Ni, Fe, and/or Co, and alloys thereof. Finally, the dielectric layer includes a non-magnetic material such as $Al_2O_3$.

In one example, the MRAM metal stack 30 includes the non-magnetic resistive layers 34 and 36 being formed from tantalum, the bottom magnetic layer 38 being formed from a NiFe/IrMn alloy, the top magnetic layer 30 being formed from a NiFeCo alloy, and the dielectric layer 44 being formed from $Al_2O_3$. It is recognized, however, that any known MRAM metal stack structure can benefit from the compositions of the present invention.

The MRAM metal stack 30 can then be patterned through the use of lithography techniques. In one example, as shown in FIG. 1E, standard resist patterns 60 or masks (positive or negative resists) can be formed on the MRAM stack 30, and subsequently processed to form the patterned metal stack.

Figure 2A:
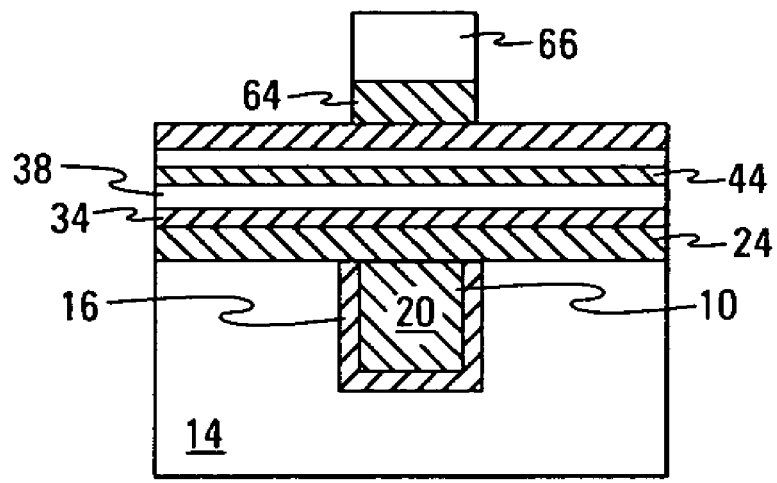
FIGS. 2A and 2B are cross-sectional representations of an MRAM structure, and intervening structure thereof, having etch residue cleaned by the compositions of the present invention.

Alternatively, as shown in FIG. 2A, a hard mask 64 can be formed through the use of known techniques. The hard mask 64 can be formed of, for example, low silane oxides, silicon nitride or silicon oxynitride. Further, for example, sacrificial hard mask 64 may be patterned using resist 66, as is known, resulting in the structure of FIG. 2A.

The standard resist pattern 60 and the hard mask 64 serve as a mask for etching the MRAM stack 30. The MRAM stack may be etched in either alternative embodiment using standard etching techniques, such as reactive ion etching. Patterning the MRAM stack 30 can expose at least a portion of a silicon containing region (e.g., interlayer 24) positioned relative the metal containing region (e.g., MRAM stack 30). The etching process results in the production of processing byproducts 70, including byproducts that contain both metal and silicon. Examples of the processing byproducts 70 are as previously discussed.

For reactive ion etching (RIE), any number of etching gases can be used. Etching gases used in the RIE process may include, but are not limited to, chlorine based etch gases, fluorine based etch gases, bromine based etch gases, or mixtures of one or more of any of the preceding etch gases. Etch gases can include one or more of other various carrier gasses.

Figure 2B:
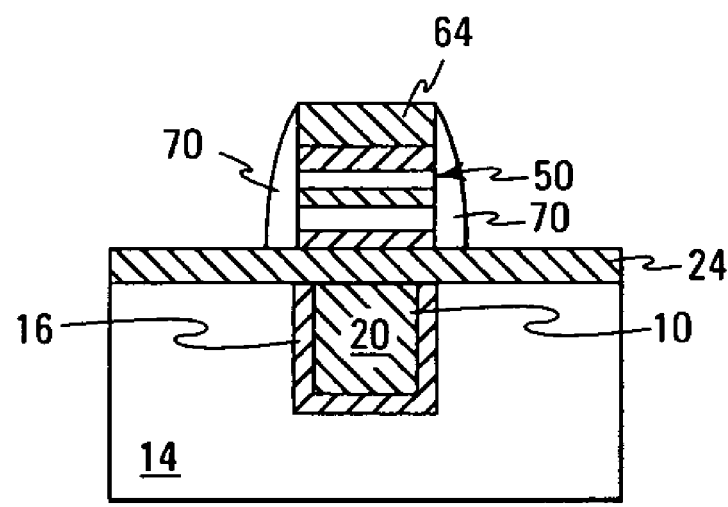

The structures illustrated in FIG. 1E or 2B can be exposed to a cleaning composition of this invention after patterning of the metal stack to remove the processing 70 byproducts. The exposure time needed for effectively cleaning the processing byproducts 70 can vary depending on various factors. For example, such factors may include the type of composition used to remove the processing byproducts 70, the length of time the processing byproducts 70 have been on the IC structure (e.g., the MRAM pattern 50), and the temperature at which the cleaning process takes place. The cleaned structures (e.g., metal containing regions and silicon containing regions) can then be rinsed, preferably, with a non-aqueous solvent. For example, the non-aqueous solvent used for rinsing may include isopropyl alcohol, methanol, ethanol, dimethylsulfoxide, tetrahydrofuran, or 2-methoxyethanol.

The time necessary to remove the processing byproducts from the surfaces can also be dependent upon which composition is utilized. Preferably, when the non-aqueous compositions of the present invention are used, a processing time of no less than five (5) minutes is used. Further, preferably, a processing time of no greater than 20 minutes is used for the non-aqueous compositions. More preferably, the time effective to remove at least a portion of the processing byproducts from the metal containing region comprises no less than about 5 minutes and no greater than about 20 minutes. For example, such time periods are applicable, preferably, to non-aqueous compositions that include acetone and hydrogen fluoride-pyridine. Processing times will also be dependent upon the concentrations of the non-aqueous composition.

For the semi-aqueous compositions, a processing time of no less than about 30 seconds is used. Further, preferably, a processing time of no greater than about 4 minutes is used for the semi-aqueous compositions. More preferably, the time effective to remove at least a portion of the processing byproducts from the metal containing region comprises is greater than about 30 seconds and less than about 4 minutes. For example, such time periods are applicable, preferably, to semi-aqueous compositions that include glacial acetic acid and hydrogen fluoride-pyridine. Processing times will also be dependent upon the concentrations of the semi-aqueous composition.

Preferably, the chemical composition (non-aqueous and semi-aqueous) of the present invention can be used at or above ambient temperature (25 degrees Celsius). Further, preferably, the chemical composition can be used at a temperature that is no greater than about 50 degrees Celsius. Preferably, temperatures of about 25 to about 50 degrees Celsius are used for removing the processing byproducts.

The components of the present chemical composition act to remove various processing byproducts formed on the IC surface being processed. While not wishing to be bound by theory, it is believed that the fluoride attacks silicate and organosilicate residues created in the patterning process. For example, the hydrogen fluoride is effective to remove silicon containing processing byproducts. In addition, it is believed that the pyridine and solvent (e.g., acetone, glacial acetic acid) components are used to dissolve various metal halides of the processing byproducts created during the patterning process. An example of the metal halides includes metal chloride processing byproducts, such as cobalt chloride byproducts.

In addition, the compositions of the present invention can further include one or more corrosion inhibiting compounds. In one example, these corrosion inhibiting compounds can include compounds that are intended to inhibit the corrosion of metal containing surfaces of IC structures. Examples of these compounds include, but are not limited to triethanolamine, dihydroxybenzene (catechol), trihydroxybenzene (pyrogallol).

It is to be understood that the above description is intended to be illustrative, and not restrictive. Many other embodiments will be apparent to those of skill in the art upon reviewing the above description. For example, the chemical cleaning composition of this invention is particularly useful wherever a metal surface needs to be cleaned during the fabrication process. The scope of the invention should, therefore, be determined with reference to the appended claims, along with the full scope of equivalents to which such claims are entitled.

What is claimed is:

1. A method for use in removing processing byproducts, comprising:
    providing a substrate assembly comprising at least a metal containing region and processing byproducts; and
    exposing the substrate assembly to a composition for a time effective to remove at least a portion of the processing byproducts, wherein the composition consists of acetone and hydrogen fluoride-pyridine.

2. The method of claim 1, wherein the processing byproducts comprise at least one of silicon and metal halides.

3. The method of claim 1, wherein the concentration of hydrogen fluoride in the hydrogen fluoride-pyridine is at least 70 percent by weight.

4. The method of claim 1, wherein a ratio of the acetone to the hydrogen fluoride-pyridine is in a range of about 200:1 to about 50:1 by volume.

5. The method of claim 4, wherein the time effective to remove at least a portion of the processing byproducts from the metal containing region is in a range of about 5 minutes to about 20 minutes.

6. The method of claim 4, wherein exposing the substrate assembly comprises exposing the substrate assembly to the composition at a temperature of no greater than about 50 degrees Celsius.

7. The method of claim 6, wherein exposing the substrate assembly comprises exposing the substrate assembly to the composition at a temperature of about 25 degrees Celsius to about 50 degrees Celsius.

* * * * *